United States Patent
Chou

(10) Patent No.: US 7,206,212 B1
(45) Date of Patent: Apr. 17, 2007

(54) CONTENT ADDRESSABLE MEMORY (CAM) DEVICE WITH ENTRIES HAVING TERNARY MATCH AND RANGE COMPARE FUNCTIONS

(75) Inventor: Richard K. Chou, Palo Alto, CA (US)

(73) Assignee: Netlogic Microsystems, Inc., Mountain View, CA (US)

( * ) Notice: Subject to any disclaimer, the term of this patent is extended or adjusted under 35 U.S.C. 154(b) by 726 days.

(21) Appl. No.: 10/217,746

(22) Filed: Aug. 13, 2002

(51) Int. Cl.
    *G11C 15/00* (2006.01)
(52) U.S. Cl. .................................. 365/49; 365/189.07
(58) Field of Classification Search ................ 365/49, 365/189.07
    See application file for complete search history.

(56) References Cited

U.S. PATENT DOCUMENTS

| | | |
|---|---|---|
| 3,264,616 A | 8/1966 | Lindquist |
| 3,350,698 A | 10/1967 | Prichard, Jr. |
| 3,389,377 A | 6/1968 | Cole |
| 3,675,211 A | 7/1972 | Raviv |
| 4,065,756 A | 12/1977 | Panigrahi |
| 4,791,606 A | 12/1988 | Threewitt et al. |
| 4,845,668 A | 7/1989 | Sano et al. |
| 4,928,260 A | 5/1990 | Chuang et al. |
| 4,975,873 A | 12/1990 | Nakabayashi et al. |
| 4,996,666 A | 2/1991 | Duluk, Jr. |
| 5,010,516 A | 4/1991 | Oates |
| 5,014,195 A | 5/1991 | Farrell et al. |
| 5,383,146 A | 1/1995 | Threewitt |
| 5,444,649 A | 8/1995 | Nemirovsky |
| 6,081,440 A | 6/2000 | Washburn et al. |
| 6,108,227 A | 8/2000 | Voelkel |
| 6,253,280 B1 | 6/2001 | Voelkel |
| 6,266,262 B1 | 7/2001 | Washburn et al. |
| 6,289,414 B1 | 9/2001 | Feldmeier et al. |
| 6,389,507 B1 | 5/2002 | Sherman |
| 6,697,276 B1 * | 2/2004 | Pereira et al. ................. 365/39 |
| 6,876,559 B1 * | 4/2005 | Rathnavelu et al. .......... 365/49 |
| 6,906,936 B1 * | 6/2005 | James et al. .................. 365/49 |
| 2002/0007446 A1 | 1/2002 | Stark |

FOREIGN PATENT DOCUMENTS

| | | |
|---|---|---|
| WO | WO 99/23663 | 5/1999 |
| WO | WO 02/43069 | 5/2002 |

OTHER PUBLICATIONS

U.S. Appl. No. 10/963,334, Pereira.

* cited by examiner

*Primary Examiner*—Viet Q. Nguyen
(74) *Attorney, Agent, or Firm*—Bradley T. Sako

(57) ABSTRACT

A content addressable memory (CAM) (200) is disclosed that includes a value match mode, where a comparand value can be compared to a masked data value, and a range match mode where a comparand value can be compared to an upper range limit UR and a lower range limit LR. The CAM (200) may include a number of CAM cells (204-n to 204-0) that may each be connected to a compare section (109). A compare section (109) can include a first compare circuit (210) that may generate a match indication on a match line (212) and a second compare circuits (214-n to 214-0). A more significant second compare circuits (214-n) may provide upper and lower limit match results (UMn, LMn) to a less significant first compare circuit (210).

16 Claims, 4 Drawing Sheets

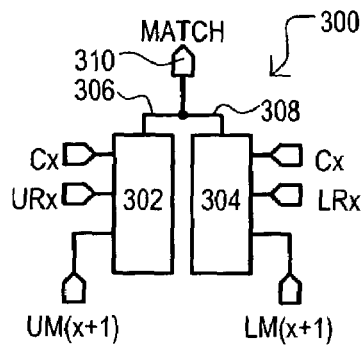
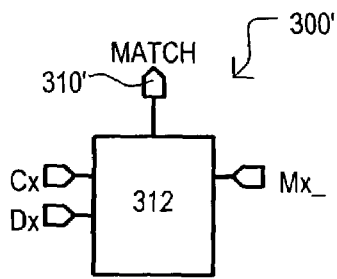
FIG. 3A  FIG. 3B
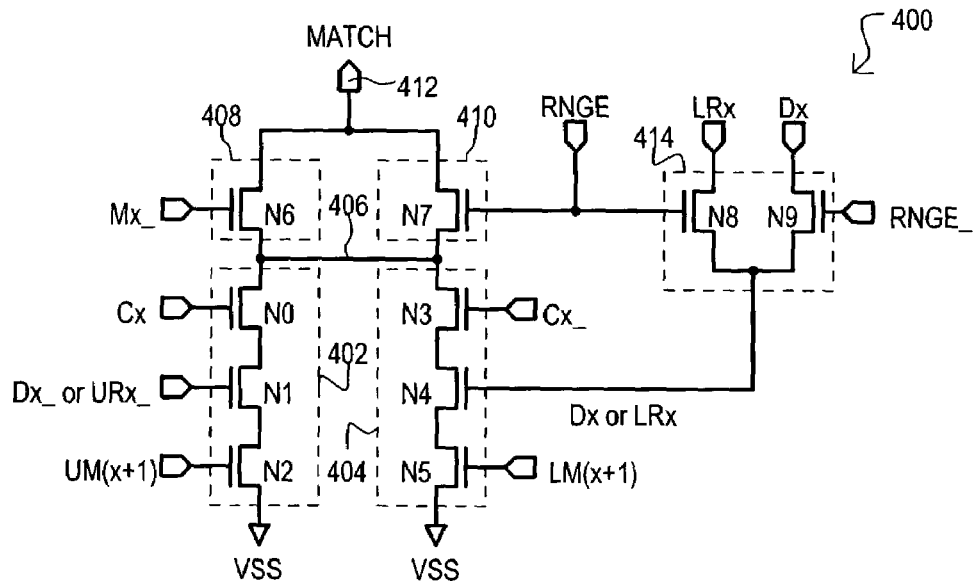
FIG. 4
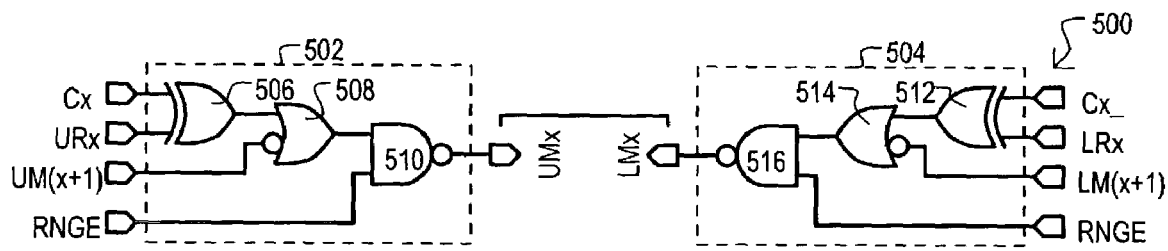
FIG. 5

CONTENT ADDRESSABLE MEMORY (CAM) DEVICE WITH ENTRIES HAVING TERNARY MATCH AND RANGE COMPARE FUNCTIONS

TECHNICAL FIELD

The present invention relates generally to content addressable memories (CAMs) and more particularly to CAMs that compare predetermined portions of comparand values with a number of data values.

BACKGROUND OF THE INVENTION

As is well known in the art, content addressable memories (CAMs) can store a number of values, each of which may represent one entry. Stored entries may then be compared to an applied comparand value to generate a match indication. The relatively rapid speed at which CAMs can compare multiple entries to an applied comparand value has resulted in CAMs enjoying widespread use in various applications, such as packet processing, as but one example.

Conventional CAMs may include binary CAMs and ternary CAMs. Binary CAMs typically include entries that can each store a data value having a number of data bits. In most cases, a match indication can be generated when all bits of a comparand value match all the bits of an entry. CAMs may also include ternary CAMs. Ternary CAMs may typically include entries having data bits, some or all of which may be masked from a compare operation.

A conventional ternary CAM array will now be briefly described. Referring now to FIG. 9, a portion of a conventional ternary CAM array is set forth in a block diagram and designated by the general reference character 900. A conventional ternary array 900 may include a number of CAM cells 902(m,n), where m can indicate a particular array row position, and n can indicate a particular array column position. Each CAM cell 902(m,n) can be connected to one or more compare lines and a match line. In the example of FIG. 9, CAM cells 902(m,n) of the same column can be connected to the same complementary compare lines 904-m. Each pair of complementary compare lines 904-m may carry a comparand value that can be compared to a data value stored within a CAM cell 902(m,n). CAM cells 902(m,n) of the same row may be connected to the same match line 906-m. In a typical arrangement, CAM cells 902(m,n) of the same row may store data bit values for one entry.

Referring now to FIG. 10, a conventional example of a ternary CAM cell is shown in a block diagram and designated by the general reference character 1000. A conventional ternary CAM cell 1000 may include a data store 1002 that may store a data bit value, a mask store 1004 that may store a mask value, and a compare circuit 1006. A compare circuit 1006 can receive a data value, mask value, and comparand value to perform a match operation. While data and mask stores may take various forms, typically some sort of flip-flop type circuit, such as a conventional static random access memory (SRAM) type cell can be used as a data and/or mask store. Similarly, a compare circuit may take a variety of forms, but usually includes an exclusive-OR (XOR) or exclusive-NOR (XNOR) type circuit.

One example of a compare circuit, such as that shown as 1006, is shown in a schematic diagram in FIG. 11. A compare circuit 1100 may be connected between a match line 1102 and a first potential, VSS. Parallel paths 1104-0 and 1104-1 may be formed between a first potential VSS and a compare node 1106. In addition, a mask circuit 1108 may be formed between the compare node 1106 and the match line 1102. A path 1104-0 may receive a compare value C and an inverse data value D_. Similarly, a path 1104-1 may receive an inverse compare value C_ and a data value D. Thus, when a compare value C does not match a data value D, the paths (1104-0 and 1104-1) may be enabled (i.e., have a low impedance), connecting (discharging) the compare node 1106 to the first potential VSS. In contrast, when a compare value C matches a data value D, the paths are disabled (i.e., have a high impedance), isolating compare node 1106 from the first potential VSS.

A mask circuit 1108 may receive a mask value M_. If a mask value is active (low in this case), a mask circuit 1108 may isolate a match line 1102 from a compare node 1106. Thus, regardless of whether a match exists between a compare value C and a data value D, a match line 1102 may remain isolated from the first potential VSS. Conversely, if a mask value is inactive (high in this case), a mask circuit 1108 may connect a match line 1102 to a compare node 1106. In such a configuration, a match line 1102 may be connected to or isolated from a first potential VSS according to a match/mis-match between a data value D and a compare value C.

In this way, ternary CAMs may provide maskable matching operations.

Various CAM applications can include a variety of matching operation types. At one end of the spectrum are "exact" match operations, such as those that may be provided by a CAM. However, other applications may include more complicated match operations. For example, in some cases it may be desirable to determine if a given comparand value, or portion thereof, falls within a given range.

Ternary CAMs may provide limited range matching by masking out consecutive least significant bits of an entry value. Such an approach may require multiple entries in the event a given matching range does not fall along a bit value boundary. As but one example, an entry 1111 XXXX (where X represents a masked bit) may be used to match a range from 255 (1111 1111) to 240 (1111 0000). However, multiple entries may be needed to match a different range, such as 255 to 246. Such multiple entries may consume too much of the available CAM entry space.

Alternative conventional approaches to providing range matches can include a processor-oriented approach. Such an approach may store upper and lower values of a range. Such values may be compared to a comparand value according to some sort of algorithm to thereby determine if a range match has occurred. Such an approach may take multiple processor cycles, thus consuming more time than a typical CAM match operation. Still further, a process and the associated memory for storing the algorithm can be a relatively expensive solution to providing range matching when compared to a single device solution that can be offered by a CAM device.

While various conventional approaches to range matching exist, there remains a need to improve the speed at which range matching can be performed. In addition, or alternatively, there is a need for a range matching solution that does not consume multiple entries, as in the case of conventional ternary CAM solutions.

SUMMARY OF THE INVENTION

According to the present invention, a content addressable memory (CAM) may include one or more locations. Each location can compare a comparand value to a maskable data value in a first mode. In addition, each location can determine if a comparand value is within a range defined by a first range value and a second range value in a second mode.

According to one aspect of the embodiments, a location can include a number of compare sections. Each compare section can include a first compare circuit with a first circuit path. In a first mode, a first circuit path may be disabled and enabled according one or more comparand value bits and one or more data value bits. In a second mode, a first circuit path may be disabled and enabled according to one or more comparand value bits and one or more first range value bits.

According to another aspect of the embodiments, a first compare circuit may also include a second circuit path. In a first mode, a second circuit path may be disabled and enabled according to one or more comparand value bits and one or more data value bits. In a second mode, a second circuit path may be disabled and enabled according to one or more comparand value bits and one or more second range value bits.

According to another aspect of the embodiments, each first compare circuit may further include a mask path. A mask path may be between a first circuit path and a match indication node. A mask path may be enabled according to at least one mask value bit.

According to another aspect of the embodiments, each first compare circuit may also include a bypass path in parallel with a mask path. A bypass path can be enabled by a mode signal.

According to another aspect of the embodiments, a location may further include a first store. A first store may store at least a portion of a data value in a first mode and at least a portion of a first range value in a second mode.

According to the present invention, a CAM may include one or more compare sections that receive a comparand value. A compare section can provide a first compare result between a comparand value and first CAM cell value in a first mode. A compare section can provide a second compare result between a comparand value and first and second CAM cell values in a second mode.

According to one aspect of the embodiments, a first compare result may be masked by a second CAM cell value in the first mode.

According to another aspect of the embodiments, a CAM can further include a number of CAM cells. A compare section may be connected to at least two CAM cells and a match line.

According to another aspect of the embodiments, a compare section can include one or more first compare circuits coupled to a first CAM cell having a significance with respect to other CAM cells. In addition, a compare section can include a second compare circuit coupled to a second CAM cell of less significance than the first CAM cell. A second compare section can receive a compare result from a first compare circuit in a second mode.

According to another aspect of the embodiments, a compare section can include a first compare circuit coupled to a multiplexer circuit. A multiplexer circuit can provide a first CAM cell value from a plurality of CAM cells in a first mode.

According to another aspect of the embodiments, a CAM-cell can store a data value bit and a corresponding mask value bit in the first mode, and a first range value bit and corresponding second range value bit in a second mode.

According to another aspect of the embodiments, a CAM may include a number of compare sections each connected to a match line. Each compare section can connect the match line to a predetermined potential according to the first compare result in a first mode. Each compare section can connect the match line to a predetermined potential according to a second compare result in a second mode.

According to the present invention, a method may include comparing a comparand value to first data value stored in a CAM location in a first mode. The method may further include comparing a comparand value to first and second data values stored in the CAM location in a second mode.

According to one aspect of the embodiments, a method may further include masking a first data value according to a second data value in a first mode.

According to another aspect of the embodiments, comparing a comparand value to a first data value can include comparing comparand value bits to first data value bits essentially simultaneously.

According to another aspect of the embodiments, a comparing a comparand value to first and second data values may include comparing comparand value bits to first data value bits at a most significant bit position prior to comparing less significant bit positions.

According to another aspect of the embodiments, a comparison of less significant bit positions with the first data value can be disabled when a comparison with a more significant bit position indicates a comparand value is within a range limit indicated by the first data value.

According to another aspect of the embodiments, a method may further include storing a data value as a first data value and storing a mask value as a second data value in the first mode. A method may also include storing a first range value as a first data value and storing a second range value as a second data value in a second mode.

BRIEF DESCRIPTION OF THE DRAWINGS

FIGS. 3A and 3B are block diagrams of showing the operation of a first compare circuit in different modes according to an embodiment.

FIG. 4 is a schematic diagram of a first compare circuit according to one embodiment.

FIG. 5 is a schematic diagram of a second compare circuit according to one embodiment.

DETAILED DESCRIPTION OF THE EMBODIMENTS

Various embodiments of the present invention will now be described with reference to a number of diagrams. The embodiments include a content addressable memory (CAM) having a first mode and a second mode. In a first mode, various entries may store a data value and a corresponding mask value. If an applied comparand value matches an entry, a match indication can be generated. In a second mode, each location may store a first range limit and a second range limit. If an applied comparand value is within the range limits, a range match indication can be generated.

Figure 1A:
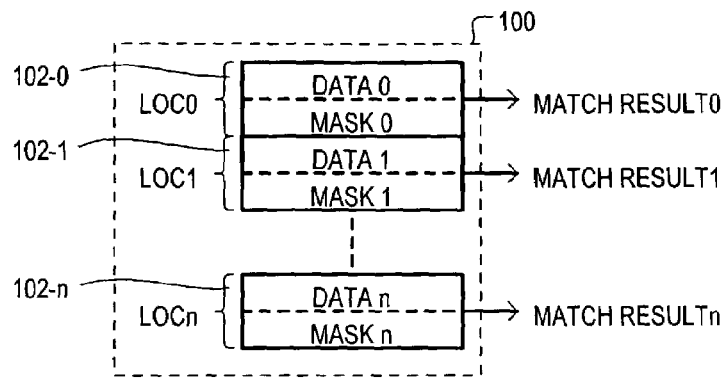
FIGS. 1A and 1B are block diagrams of content addressable memory (CAM) device according to a first embodiment.
Figure 1B:
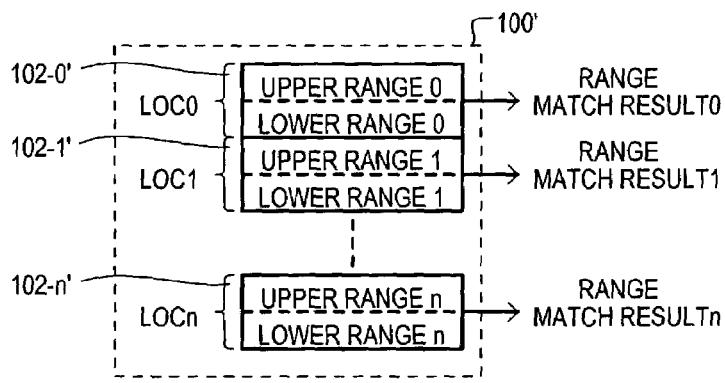

Referring now to FIGS. 1A and 1B, block diagrams are set forth showing a first embodiment of the present invention. FIG. 1A illustrates a CAM device in a first mode of operation, while FIG. 1B shows a CAM device in a second mode of operation.

Referring now to FIG. 1A, a CAM device 100 in a first mode operation may function as a ternary CAM device. A CAM device 100 may include a number of locations (LOC0 to LOCn) that may each store data values to thereby form entries 102-0 to 102-n. In particular, each entry (102-0 to 102-n) may store a data value (DATA0 to DATAn) and a corresponding mask value (MASK0 to MASKn). A mask value (MASK0 to MASKn) may mask a corresponding data value (DATA0 to DATAn) in a compare operation.

While mask values (MASK0 to MASKn) may be stored at locations that are physically separate from one another, preferably, mask values and data values may reside in a same group of CAM cells, preferably a same row of CAM cells.

As shown in FIG. 1A in a first mode of operation, each entry (102-0 to 102-n) can provide a match result (MATCH RESULT0 to MATCH RESULTn). A match result (MATCH RESULT0 to MATCH RESULTn) can indicate whether or not a comparand value matches a masked data value of an entry.

In one very particular arrangement, match results (MATCH RESULT0 to MATCH RESULTn) may be set to a first value prior to a compare operation (e.g., precharged). If a comparand matches an entry (masked data value), a corresponding match result (MATCH RESULT0 to MATCH RESULTn) may remain at the first value. If a comparand does not match an entry, a corresponding match result (MATCH RESULT0 to MATCH RESULTn) may change to a second value (e.g., discharge to a lower value).

Referring now to FIG. 1B, a CAM device 100' in a second mode operation may provide range matching functions. A CAM device 100' may include a number of locations (LOC0 to LOCn) that may each store range values to thereby form range match entries 102-0' to 102-n'. In particular, each range match entry (102-0' to 102-n') may store an upper range value (UPPER RANGE0 to UPPER RANGEn) and a corresponding lower range value (LOWER RANGE0 to LOWER RANGEn). An upper range value (e.g., UPPER RANGE0) and corresponding lower range value (e.g., LOWER RANGE0) may define a range with which an applied comparand value may be compared to.

As in the case of a first mode of operation, while lower range values (LOWER RANGE0 to LOWER RANGEn) may be stored at locations that are physically separate from upper range values (UPPER RANGE0 to UPPER RANGEn), preferably, lower range values and upper range values may reside in a same group of CAM cells, preferably a same row of CAM cells. Even more preferably, in a first mode of operation, a first portion of an entry may store a data value while a second portion may store a mask value, and in a second mode of operation, a first portion of an entry may store an upper range value while a second portion may store a lower range value.

As shown in FIG. 1B in a second mode of operation, each entry (102-0' to 102-n') can provide a range match result (RANGE MATCH RESULT0 to RANGE MATCH RESULTn). A range match result (RANGE MATCH RESULT0 to RANGE MATCH RESULTn) can indicate whether or not an applied comparand value falls within a range defined by an upper range value and lower range value.

In one very particular arrangement, range match results (RANGE MATCH RESULT0 to RANGE MATCH RESULTn) may be set to a first value prior to a compare operation (e.g., precharged). If a comparand value falls within a range defined by an upper range value and a lower range value, a corresponding range match result (RANGE MATCH RESULT0 to RANGE MATCH RESULTn) may remain at the first value. If a comparand does not fall within a range defined by an upper and lower range value, a corresponding range match result (RANGE MATCH RESULT0 to RANGE MATCH RESULTn) may change to a second value (e.g., discharge to a lower value).

In this way a CAM device according to one embodiment may include a number of entries, each having a data value and a mask value, which can generate match results. Alternatively, such entries may each have upper and lower range values, and generate range match results.

FIG. 1A also shows how a comparand value may be compared to first data value in a first mode. For example, a comparand value may be compared with data value DATA 0 to generate a result MATCH RESULT 0. At the same time FIG. 1B shows how a comparand value may be compared to first data and second data values in a second mode. For example, a comparand value may be compared with a first range value UPPER RANGE 0 and a second range value LOWER RANGE 0 to generate a result RANGE MATCH RESULT 0.

FIG. 1A further shows a first data value may be masked by a comparand value.

Figure 2:
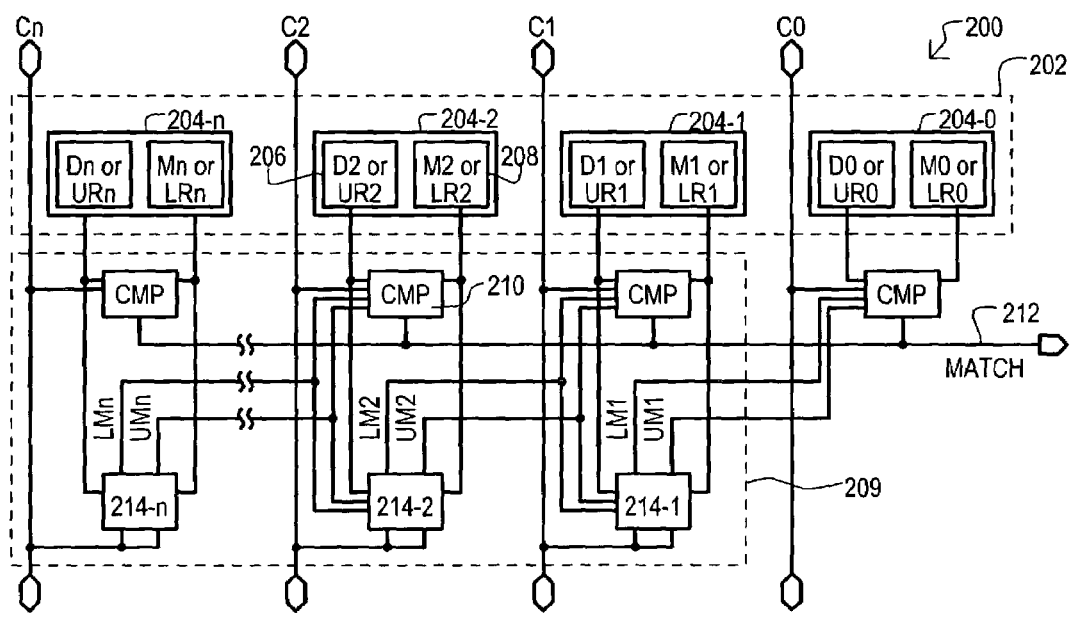
FIG. 2 is a block diagram of a CAM device according to a second embodiment.

Referring now to FIG. 2, a content addressable memory (CAM) according to a second embodiment is set forth in a block schematic diagram and designated by the general reference character 200. A CAM 200 may include at least one location 202 that may store particular values according to a particular mode. In a first mode, a location 202 may store a data value and corresponding mask value. In a second mode, a location 202 may store an upper range limit and lower range limit.

Thus, in a first mode data and mask values may be stored. However, in a second mode, first and second range values may be stored.

While a location 202 may take various forms, the embodiment of FIG. 2 includes a location 202 in which data and mask values are stored within a same CAM cell.

In the example of FIG. 2, a location 202 may include a number of multipurpose CAM cells 204-n to 204-0. Each multipurpose CAM cell (204-n to 204-0) may include a first storage circuit, one of which is shown as item 206 and a second storage circuit, one of which is shown as item 208. In a first mode, first storage circuits 206 may store a data value (Dn to D0), while a second storage circuit 208 may store a corresponding mask value (M0 to Mn). In contrast, in a second mode, first storage circuits 206 may store one range limit, while second storage circuits 208 may store another range limit. In the very particular case of FIG. 2, first storage circuits 206 may store an upper range limit (URn to UR0), while second storage circuits 208 may store a lower range limit (LRn to LR0).

A first storage circuit 206 and/or a second storage circuit 208 may include circuits that can store data values, such as a memory cell. Preferably, first and/or second storage circuits (206 and/or 208) may include random access memory (RAM) type cells, even more preferably static RAM (SRAM) type cell.

In one arrangement, data may be read from and written to storage circuits by activation of a word line (not shown), which may connect one or more bit lines (not shown) to a storage circuit. In some variations, a line that carries a comparand value may also serve as a bit line, while in others, bit lines may be separate from comparand lines.

Further, it is understood that a first storage circuit 206 and/or a second storage circuit 208 may provide complementary data/range values. Thus, a comparand line of FIG. 2 and/or values provided by first and second storage circuits (206 and 208) may be complementary values provided by a pair of comparand lines.

As shown in FIG. 2, a CAM 200 may include a compare section 209 having first compare circuits associated with a location 202. One particular first compare circuit is shown as item 210. In the particular example of FIG. 2, a first compare circuit 210 may be associated with each multipurpose CAM cell (204-n to 204-0). A first compare circuit 210 may compare values received from an associated multipurpose CAM cell (204-n to 204-0). However, a particular comparison result can vary according to a particular mode.

One particular operation of a first compare circuit 210 will now be described.

In a first mode, a first compare circuit 210 may compare a comparand bit value (Cn to C0) to a corresponding data bit value (Dn to D0). Such a compare operation may be a "ternary" compare operation that may take into account masking. Thus, if a comparand bit value (Cn to C0) matches its corresponding data bit value (Dn to D0), or the data bit value (Dn to D0) is masked by a corresponding mask bit value (Mn_ to M0_), a match indication may be generated. Conversely, if a comparand bit value (Cn to C0) does not match its corresponding data bit value (Dn to D0), and the data bit value is not masked by its mask bit value (Mn_ to M0_, a mismatch indication may be generated.

Match and mismatch indications may take various forms. As but one very particular example, a mismatch indication may include discharging/charging a node to a predetermined state, while a match indication may include maintaining a node at a predetermined precharged state, or vice versa.

In FIG. 2, if all first compare circuits 210 generate a match indication, a match line 212 may activate, or maintain in an active state, a match signal MATCH. If a mismatch indication is generated by a first compare circuit 210, a match signal MATCH may be deactivated.

It is understood that in a first mode, first compare circuits 210 can compare a data value (Dn to D0) to a comparand value (Cn to C0) essentially simultaneously.

First compare circuits 210 may operate differently in a second mode than in a first mode. In a second mode, a first compare circuit 210 may compare a comparand bit value (Cn to C0) to a corresponding first range bit value (URn to UR0) and second range bit value (LRn to LR0). Unlike a conventional CAM match operation, match/mismatch indications may be generated according to how a comparand bit value (Cn to C0) differs from a first and second range bit values (URn to UR0 and LRn to LR0), and according to a range bit comparison of a more significant bit.

A more detailed example of such a range comparison will be described in more detail below.

In addition to first compare circuits 210, a compare section 209 may include second compare circuits (214-n to 214-1). Second compare circuits (214-n to 214-1) may also be associated with a location 202. In the arrangement of FIG. 2, second compare circuits (214-n to 214-1) may compare a comparand bit value (Cn to C1) to corresponding first and second range bit values (URn to UR1 to LRn to LR1).

According to such a comparison, and a previous such comparison result, second compare circuits (214-n to 214-1) can generate lower range match values (LMn to LM1) and upper range match values (UMn to UM1). Such values may then be provided to first and second compare circuits corresponding to a bit of less significance.

For example, second compare circuit 214-2 can generate a lower and upper range match values LM2 and UM2 associated with bit 2. Such range match values (LM2 and UM2) can be provided to second compare circuit 214-1 and first compare circuit 206 associated with a less significant bit 1.

Further, as shown in FIG. 2, a most significant second compare circuit 214-n may not receive any higher significance upper or lower range match values. Further, a least significant bit (e.g., bit 0) may not include a second compare circuit.

Thus, it is understood that in a second mode, first compare circuits 210 may first compare a most significant bit position. Such a comparison may enable or disable comparisons to bit positions of lower significance. More particularly, once a comparison of a comparand bit and an upper range bit indicates a comparand is less than an upper range value, comparisons of less significant bits may be disabled. Similarly, once a comparison of a comparand bit and a lower range bit indicates a comparand is more than a lower range value, comparisons of less significant bits may be disabled.

Having described a particular CAM arrangement in FIG. 2, a first example of a range matching operation will now be described in more detail. In the first example, an applied comparand value can be greater than an upper range, and thus outside a range indicated by a location 200.

For the given example, it will be assumed a location 202 can compare four bit values. Further, it will be assumed that a location 202 stores an upper range limit of 1100 (in first storage circuits 206) and a lower range limit of 0111 (in second storage circuits 208), with digit significance decreasing from left to right. It will be further assumed that a first comparand value of 1110 is applied.

Initially, the most significant comparand bit "$\underline{1}$110" (underlined) can be compared in a first compare circuit 210 to determine if it is less than the corresponding upper range limit bit "$\underline{1}$100" (underlined). Because the comparand bit is not greater than the upper range bit, the first compare circuit can generate a match indication. Further, a second compare circuit 214-n can generate an active upper range match result (UMn) that can enable an upper range comparison to continue with the next (lower) significant bit.

In a comparison operation for a next significant bit, because the next most significant comparand bit "1$\underline{1}$10" (underlined) is not greater than the corresponding upper range limit bit "1$\underline{1}$00" (underlined), a first compare circuit 210 can generate a match indication, while a second compare circuit 214-2 can enable a compare operation to continue to a next (lower) significant bit.

In a comparison operation for a next significant bit, because to the third comparand bit "11$\underline{1}$0" (underlined) is greater than the third upper range limit bit "11$\underline{0}$0" (underlined), the comparand value 1110 can be determined to be greater than an upper range limit 1100, and thus is outside the location range. In response, a first compare circuit 210 can generate a range mismatch indication.

In one very particular approach, a range mismatch indication can discharge a match line 212 thereby generating an inactive match signal MATCH.

At the same time a comparand value is compared with an upper range limit, the comparand value may be compared with a lower range limit. Thus, in the above example, initially, the most significant comparand bit "1110" (underlined) can be compared in a first compare circuit to determine if it is less than the corresponding lower range limit bit "0111" (underlined). Because the comparand bit is greater than the lower range bit, the comparand can be determined to be within a lower range limit. Thus, a first compare circuit 210 can generate a match indication. Further, a second compare circuit can generate an inactive lower range match result that can cascade through the remaining first and second compare circuits (those corresponding to less significant bits). This can essentially disable compare operations for a lower range limit. As a result, less significant bit comparisons with a lower range value can be prevented from generating a mismatch indication.

A second example will now be described in which an applied comparand value is within a range.

For the following second example, it will be assumed that a location stores the upper range limit of 1100 and a lower range limit of 0111 previously described. It will be further assumed that a first comparand value of 1000 is applied.

Initially, the most significant comparand bit "1000" (underlined) can be compared in a first compare circuit 210 to determine if it is less than the corresponding upper range limit bit "1100" (underlined). Because the comparand bit is not greater than the upper range limit bit, an upper range comparison may continue to a next (less) significant bit.

Because the second comparand bit "1000" (underlined) is less than the corresponding upper range bit "100" (underlined), the comparand can be assumed to be within an upper range limit. Thus, a first compare circuit 210 can generate a match indication. Further, a second compare circuit can generate an inactive upper range match result that can cascade through the remaining first and second compare circuits (those corresponding to less significant bits), essentially disabling compare operations. This can prevent less significant bit comparisons with an upper range from generating mismatch indications.

The lower range comparison in the second example may proceed in the same fashion as that of the first example. Thus, with both upper and lower range comparisons indicating a match, and preventing any lower significance mismatches from occurring, a range match indication can be generated indicating the given comparand is within the lower and upper range limits.

In one very particular approach, a range match indication can include match line 212 remaining at a precharged state thus producing an active match signal MATCH.

A third example will now be described in which an applied comparand value is less than a range.

For the following third example, it will be assumed that a location stores the upper range limit of 1100 and a lower range limit of 0111, as previously described. It will be further assumed that a first comparand value of 0011 is applied.

The upper range comparison of this third example may proceed in the same fashion as that of the second example. Thus, an upper range comparison can indicate that the comparand value is within an upper range limit.

In a corresponding lower range comparison, initially a most significant comparand bit "0011" (underlined) can be compared in a first compare circuit 210 to determine if it is less than the corresponding lower range limit bit "0111" (underlined). Because the comparand bit is not less than the lower range bit, a first compare circuit 210 can generate a match indication. Further, a second compare circuit 214-n can generate an active lower range match result that can enable a lower range comparison to continue with the next significant bit. In the third example, because the second comparand bit "0011" (underlined) is less than the second lower range limit bit "0111" (underlined), the comparand value 0011 can be determined to be below a lower range limit 0111, and thus is outside the location range. A first compare circuit 210 can generate a range mismatch indication.

In this way, upper and lower range limits comparisons may be performed on an applied comparand value to generate a range match indication if the comparand value is within the range limits, and a range mismatch indication if the comparand value is outside the limits.

By providing such a range matching capability, a CAM according to the present invention may store various ranges in a more compact fashion, as ranges do not necessarily have to fall along bit boundaries, as is the case in conventional ternary CAM approaches.

Having described one particular CAM arrangement, particular examples of a first compare circuit will now be described.

Referring now to FIGS. 3A and 3B, block diagrams are set forth showing how a first compare circuit may operate according to different modes. In particular, FIG. 3A shows a first compare circuit configuration for a range matching operation, while FIG. 3B shows a first compare circuit configuration for a conventional match operation.

In FIG. 3A, a first compare circuit is designated by the general reference character 300 and may include an upper range match section 302 and a lower range match section 304.

An upper range match section 302 may receive a comparand value Cx, an upper range value URx, and a more significant bit upper range match result UM(x+1). Provided upper range match result UM(x+1) is active, an upper range match section 302 can generate a mismatch result (at an upper match result node 306) when a comparand value Cx is greater than an upper range value URx. A match result may be generated when a comparand value Cx is not greater than an upper range value URx. However, if upper range match result UM(x+1) is inactive, a match result can be generated at node 306 regardless of the values of Cx and URx.

It is understood, and will shown below, that the particular polarities of signals received by an upper range match section 302 can vary according to the logic of the upper match section 302. Thus, a received comparand value Cx may include an inverted value Cx_, a non-inverted value Cx, or both. The same can be true for other signals received by an upper range match section 302 (e.g., URx and UM(x+1)).

In a similar fashion to an upper range match section 302, a lower range match section 304 may receive a comparand value Cx, a lower range value LRx, and a more significant bit lower range match result LM(x+1). Provided a lower range match result LM(x+1) is active, a lower range match section 304 can generate a mismatch result (at a lower match result node 308) when a comparand value Cx is less than a lower upper range value URx. A match result may be generated when a comparand value Cx is not lower than an upper range value LRx. However, if lower range match result UM(x+1) is inactive, a match result can be generated at node 308 regardless of the values of Cx and LRx.

As in the case of the upper range section 302, the polarity of various values received by a lower range match section 304 may also vary according to the particular logic of the lower range match section 304.

Should a mismatch indication be generated at either an upper match result node 306 or a lower match result node 308, a mismatch indication can be generated at a match node 310. As shown in FIG. 3A, upper and lower match result nodes (306 and 308) may be coupled to one another, or may be the same node. Such an arrangement may work with a precharged match node 310 that can be discharged by a mismatch indication.

Referring back to FIG. 2, it will be recalled that a first compare circuit 210 for most significant bit (bit n) may not receive an upper or lower range match result. Thus, a first compare circuit for a most significant bit can function as if upper and lower range match results (UM(x+1) and LM(x+1)) are active.

In FIG. 3B, a first compare circuit is designated by the general reference character 300' and may include a maskable compare circuit 312. A maskable compare circuit 312 may receive a comparand value Cx, a data value Dx, and a mask value Mx_. Provided a mask value Mx_ is inactive, a maskable compare circuit 312 can generate a mismatch result at a match node 310' when a comparand value Cx is different than a data value Dx. However, if mask value Mx_ is active, a match result can be generated at match node 310' regardless of the values of Cx and Dx.

Of course, the polarity of various values received by a maskable compare circuit 312 can vary according to the particular logic of the maskable compare circuit 312.

While a first compare circuit may include separate circuit structures for implementing a range match function and conventional ternary match function, it can be desirable to share circuit structure and thereby reduce/minimize circuit area occupied by a first compare circuit.

A more detailed example of a first compare circuit that provides both range matching and ternary match functions is set forth in FIG. 4, and designated by the general reference character 400.

FIG. 4 includes various signals. In the description it will be understood that the inverse of a signal may be represented by a trailing underscore. Thus, while "Cx" can refer to a comparand value bit, "Cx_" is understood to be a complementary value to such a bit.

A first compare circuit 400 may include a first circuit path 402 and a second circuit path 404 that can have different responses in different modes. In particular, a first circuit path 402 may be enabled/disabled according to a comparand value Cx, an upper range value URx_, and a more significant upper match result UM(x+1), in a range match mode. In a value match mode, the first circuit path 402 may be enabled/disabled according to a comparand value Cx and a data value Dx_.

Similarly, in a range match mode, a second circuit path 404 may be enabled/disabled according to a comparand value Cx_, a lower range value LRx, and a more significant lower match result LM(x+1). In a value match mode, a second circuit path 404 may be enabled/disabled according to a comparand value Cx_ and a data value Dx.

In the particular example of FIG. 4, a first circuit path 402 may include transistors N0–N2 having source-drain paths arranged in series. Transistors N0–N2 may include n-channel insulated gate field effect transistors (IGFETs), as but one example. Transistor N0 may receive a comparand value Cx at its gate in both a range match mode and value match mode. The gate of transistor N1 can receive an upper range value URx_ in a range match mode, and a data value Dx_ in a value match mode. The gate of transistor N2 can receive a more significant upper match result value UM(x+1) at its gate in both a range match mode and value match mode. Such an upper match result value UM(x+1) can be forced high in a value match mode.

In the particular example of FIG. 4, a second circuit path 404 may include transistors N3–N5 having source-drain paths arranged in series. Transistors N3–N5 may include n-channel insulated gate field effect transistors (IGFET), as but one example. Transistor N3 may receive a comparand value Cx_ at its gate in both a range match mode and value match mode. A gate of transistor N4 can receive a lower range value LRx in a range match mode, and a data value Dx in a value match mode. A gate of transistor N5 can receive a more significant lower match result value LM(x+1) in both a range match mode and value match mode. Such a lower match result value LM(x+1) can be forced high in a value match mode.

Thus, as can be seen in FIG. 4, a first compare circuit 400 may provide a comparison between a comparand value (Cx and Cx_) and a data value (Dx_ and Dx) in a value match mode with first and second circuit paths (402 and 404). However, in a range match mode a first compare circuit 400 may provide a comparison between a comparand value (Cx) and an upper range value (URx_) with a first circuit path 402, and a comparison between the comparand value (Cx) and a lower range value (LRx) in a second circuit path 404.

In one arrangement, as shown in FIG. 4, first and second signal paths (402 and 404) can be arranged in parallel between a signal node 406 and a first predetermined potential VSS.

As noted above, a first compare circuit for a most significant bit may not receive an upper or lower range match result. Thus, a first compare circuit for a most significant bit may not include transistors N2 and/or N5.

A first compare circuit 400 may further include a mask path 408 and a bypass path 410. A mask path 408 may be enabled/disabled according to a mask value Mx_. A bypass path 410 can bypass the mask path in a range match mode. A mask path 408 and bypass path 410 may be arranged in parallel between a signal node 406 and a match node 412.

In the particular example of FIG. 4, a mask path 408 may include a mask transistor N6 having a source-drain path between a signal node 406 and a match node 412. A bypass path 410 may be situated in parallel with mask path 408, and in the particular example of FIG. 4, may include a bypass transistor N7 having a source-drain path between a signal node 406 and a match node 412. A mask transistor N6 may include an n-channel IGFET that receives a mask value Mx_ at its gate. A bypass transistor N7 may include an n-channel IGFET that receives a mode signal RNGE at its gate.

In FIG. 4, a multiplexer circuit 414 can be associated with a first compare circuit 400. In a range match mode, a multiplexer circuit 414 can provide a lower range value LRx to a second circuit path 404. In a value match mode, a multiplexer circuit 414 can provide a data value Dx to a second circuit path 404. In the particular example of FIG. 4, a multiplexer circuit 414 may include two transistors N8 and N9 having source-drain paths arranged in parallel that receive complementary mode signals (RNGE and RNGE_) at their control terminals.

Having described the general arrangement of first compare circuit 400, the operation of the first compare circuit 400 will now be described.

In a value match mode, a mode signal RNGE can be low, while upper and lower match results (UM(x+1) and LM(x+1)) can both be high. Thus, transistor N7 may be turned off (introducing a high impedance path), while transistors N2 and N5 may both be on (introducing a lower impedance path). Further, within multiplexer circuit 414, transistor N8 can be turned off and transistor N9 can be turned on, supplying data value Dx to the gate of transistor N4.

In such a state, a compare circuit 400 can function as a maskable exclusive OR type circuit. More particularly, if a comparand value Cx is high and the corresponding data value Dx is low, transistors N0 and N 1 can turn on. Because transistor N2 is already on, a first circuit path 402 can be enabled, coupling signal node 406 to a first potential VSS. Similarly, if a comparand value Cx is low and the corresponding data value is high Dx, transistors N3 and N4 can turn on. Because, transistor N5 is already on, a second circuit path 404 can be enabled, coupling a signal node 406 to a first potential VSS.

On the other hand, if a comparand value Cx is the same as data value Dx, either transistor N0 or N1 can be turned off within a first circuit path 402, while either transistor N3 or N4 can be turned off within second circuit path 404. This can disable both the first and second circuit paths (402 and 404).

A signal node 406 may be selectively connected to a match node 412 according to a mask value Mx_. Because transistor N7 is turned off, a mask path 408 is not bypassed.

In a range match mode, a mode signal RNGE can be high, while upper and lower match results (UM(x+1) and LM(x+1)) can vary according to more significant bit match results. With a mode signal RNGE high, transistor N7 can be turned on, bypassing a mask path 408. In addition, within multiplexer circuit 414, transistor N8 can be turned on and transistor N9 can be turned off, supplying lower range value LRX to the gate of transistor N4.

In such a state, a compare circuit 400 can function as a range compare circuit. More particularly, if a more significant upper range match result UM(x+1) is active, a comparand value Cx can be compared with an upper range value URx_ within a first circuit path 402. If a comparand value is high, and an upper range value URx_ is low, a comparand value can be outside an upper range and a first circuit path 402 can be enabled. If a more significant upper range match result UM(x+1) is inactive, transistor N2 can be turned off, and a first circuit path 402 can be forced into a disabled state. In this way, a first circuit path 402 may provide an indication reflecting a comparison between a comparand value Cx and an upper range value URx_.

Within a second circuit path 404, if a more significant lower range match result LM(x+1) is active, a comparand value Cx_ can be compared with a lower range value LRx within a second circuit path 404. If a comparand value is low, and a lower range value LRx is high, a comparand value can be outside a lower range, and a second circuit path 402 can be enabled. If a more significant lower range match result LM(x+1) is inactive, transistor N5 can be turned off, and a second circuit path 402 can be forced into a disabled state. In this way, a second circuit path 404 may provide an indication reflecting a comparison between a comparand value Cx_ and a lower range value LRx.

Because a mask path 408 can be bypassed in a range match mode, a signal node 406 can be connected to a match node 412. Thus, when a comparand exceeds an upper range, a first circuit path 402 can be enabled, connecting a match node 412 to a first potential VSS. Similarly, when a comparand falls below a lower range, a second circuit path 404 can be enabled, connecting a match node 412 to a first potential VSS. However, if a comparand value is less than an upper range and greater than a lower range, first and second circuit paths (402 and 404) can both be disabled, isolating a match node 412 from a first potential VSS.

An example of a second compare circuit will now be described with reference to FIG. 5. A second compare circuit is designated by the general reference character 500 and may include an upper range portion 502 and a lower range portion 504. An upper range portion 502 can receive a comparand value Cx, an upper range value URx, a more significant upper match result UM(x+1), and a mode value RNGE. An upper range portion 502 can provide an upper range match result UMx.

In a value match mode, an upper range match result UMx can be forced to an active state (high in this case). In range match mode, an upper range match result UMx can vary according to whether a more significant upper range match result UM(x+1) is active or inactive. More particularly, an inactive (low in this case) upper range match result UM(x+1) can force the lower significance upper range match result UMx to an inactive state. If a more significant upper range match result UM(x+1) is active (high in this case), a lower significance upper range match result UMx can vary according to whether a comparand value Cx is different than an upper range match result URx.

A lower range portion 504 can receive a comparand value Cx, a lower range value LRx, a more significant lower match result LM(x+1), and a mode value RNGE. A lower range portion 504 can provide a lower range match result LMx.

In a value match mode, like an upper range match result UMx, a lower range match result LMx can be forced to an active state (high in this case). In range match mode, a lower range match result LMx can vary according to whether a more significant lower range match result LM(x+1) is active or inactive. An inactive (low in this case) lower range match result LM(x+1) can force the lower significance upper range match result LMx to an inactive state. If a more significant lower range match result LM(x+1) is active (high in this case), a lower significance upper range match result LMx can vary according to whether a comparand value Cx is different than a lower range match result LRx.

In the example of FIG. 5, an upper range portion 502 may include a two-input exclusive OR (XOR) gate 506 that receives a comparand value Cx as one input and an upper range value URx as another input. An output of XOR gate 506 may be provided as an input to an OR gate 508. Another input to OR gate 508 may receive an inverted more significant upper range match result UM(x+1). An output of OR gate 508 may be provided as an input to a NAND gate 510. Another input to NAND gate 510 may receive a mode value RNGE. An output of NAND gate 510 can be the upper range match result value UMx.

In the example of FIG. 5, a lower range portion 504 can have the same general construction as an upper range portion 502, including a XOR gate 512 that receives a comparand value Cx and a lower range value LRx, an OR gate 514 connected to the output of XOR gate 512 and a more significant lower range match result LM(x+1), and a NAND gate 516 connected to the output of OR gate 514 and a mode signal RNGE. An output of NAND gate 516 can be a lower range match result value LMx.

As can be seen by FIG. 5, in a value match mode, a mode value RNGE can be low. With a low input, the output of NAND gates 510 and 516 can each be forced high. In this way, in a value match mode, upper and lower range match results (UMx and LMx) can be forced high.

In a range match mode, a mode value RNGE can be high, forcing NAND gates 510 and 516 to function essentially as inverters. Within an upper range portion 502, in the event a more significant upper match result UM(x+1) is inactive (low), a high value will be input to OR gate 508. This can force the output of OR gate 508 high. With the output of OR gate 508 and a mode value RNGE both high, an upper range match result UMx can be forced inactive (low). In this way, an inactive more significant upper match result UM(x+1) can force a less significant upper match result UM(x+1) to an inactive state.

However, if a more significant upper match result UM(x+1) is active (high), a low value will be input to OR gate 508. Thus, OR gate 508 can pass through the output of XOR gate 506. Consequently, if the output of XOR gate 506 is low, indicating a comparand value Cx is the same as an upper range value URx, upper range match result UMx can be active (high). Conversely, if a the output of XOR gate 506 is high, indicating a comparand value is different than an upper range value URx, upper range match result UMx can be forced to an inactive state.

From the above detailed description of the upper range portion 502, the operation of the lower range portion 504 naturally follows.

Of course, the particular second compare circuit of FIG. 5 may take a variety of forms and be implemented in various ways. Accordingly, the particular logic and signal polarities shown in FIG. 5 should not be construed as limiting the invention. Alternate logic could arrive at the same or similar function. Further, such alternate logic could receive input values of different polarity than those shown in FIG. 5, or complementary sets of such values.

The above embodiments have indicated that first and second compare circuits can each be associated with a particular bit location. However, such a correspondence does not have to be one-to-one with respect to a location. That is, a compare circuit may be shared among multiple locations. In such an arrangement, upper and lower range limits may be sequentially entered for different CAM locations.

Figure 6:
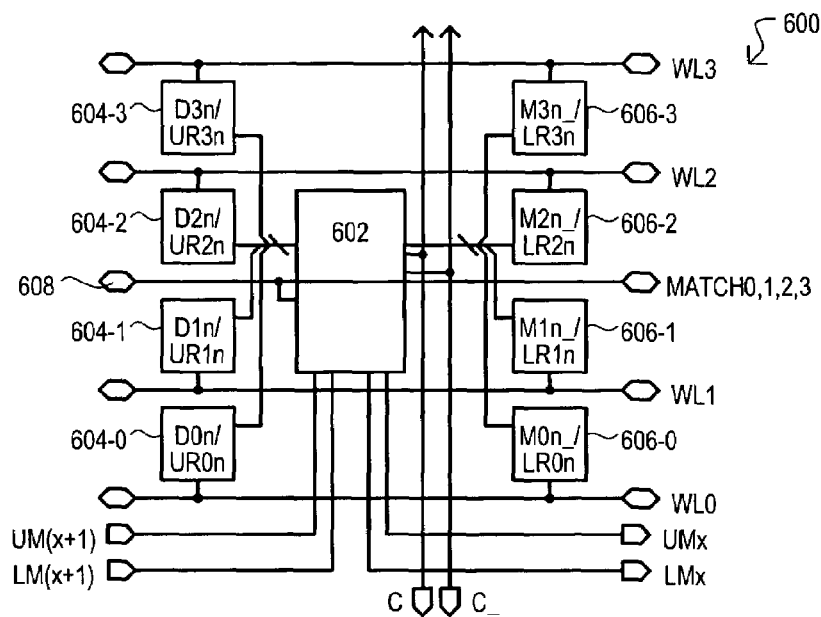
FIG. 6 is a block diagram of third embodiment.

One example of a shared first and second compare circuit arrangement is set forth as a second embodiment in FIG. 6.

Referring now to FIG. 6, a CAM 600 according to a second embodiment may include a shared compare section 602 that is shared among multiple locations. In the particular example of FIG. 6, four locations may correspond to word lines WL3 to WL0. First storage locations 604-3 to 604-0 may store an nth data bit of data values forming entries at four locations. In a second mode, first storage locations (604-3 to 604-0) may store an nth bit of a first range limit, such as an upper range limit, for entries at four locations. Similarly, in a first mode of operation, second storage locations (606-3 to 606-0) may store an nth data bit of mask values for four entries. In a second mode, second storage locations 606-3 to 606-0 may store an nth bit of a second range limit, such as a lower range limit, for entries at four locations.

In a first mode, first storage locations (604-3 to 604-0) can provide a data bit value (D3$n$ to D0$n$) to a shared compare section 602. Similarly, second storage locations (606-3 to 606-0) can provide a mask bit value (M3$n\_$ to M0$n\_$) to a shared compare section 602. A compare section 602 may also receive a comparand bit value C/C_. In response to such values, a shared compare section 602 may generate match/mismatch indications on a match line 608 according to whether data bit values (D3$n$ to D0$n$) are masked by corresponding mask values, and whether such data bit values (D3$n$ to D0$n$) match a comparand bit value C/C_.

In a second mode, first storage locations (604-3 to 604-0) can provide first range values (UR3$n$ to UR0$n$) to a shared compare section 602. Second storage locations (606-3 to 606-0) can provide second range values (LR3$n$ to LR0$n$) to a shared compare section 602. A compare section 602 may also receive a comparand value C/C_, as well as more significant first and second range match values (UM(x+1) and LM(x+1)). In response to such values, a shared compare section 602 may generate match/mismatch indications on a match line 608 according to whether a comparand value is within a range established first and second range values. A compare section 602 may also generate more significant first and second range match values for a shared compare section corresponding to a less significant bit.

Figure 7:
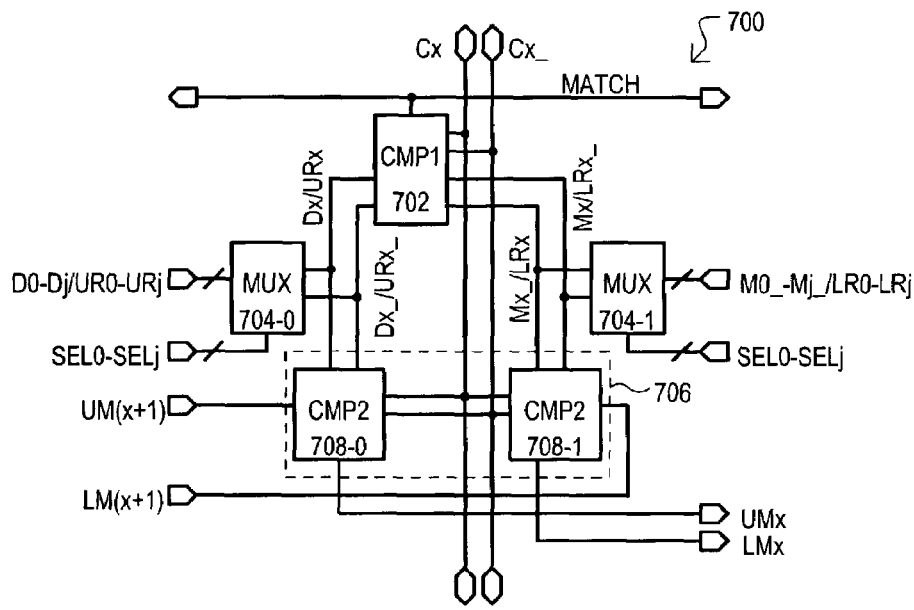
FIG. 7 is a block schematic diagram of a shared compare section according to one embodiment.

Referring now to FIG. 7, a more detailed example of a shared compare section is shown in a block schematic diagram and designated by the general reference character 700.

A shared compare section 700 may include a first compare circuit 702. A first compare circuit 702 can function in a similar fashion to first compare circuits described above, and with reference to FIGS. 3A, 3B and 4. However, as shown in FIG. 7, data/mask/range values can be provided to a first range circuit by way of multiplexer circuits 704-0 and 704-1.

A shared compare section 700 may also include a second compare circuit 706. A second compare circuit 706 can function in a similar fashion to second compare circuits described above, and with reference to FIG. 4. A second compare circuit 706 may include a first range portion 708-0 and a second range portion 708-1. In the particular example of FIG. 7, a first range portion 708-0 can be an upper range portion, while a second range portion 708-1 can be a lower range portion. In addition, range values can be provided to a second range circuit 706 by way of multiplexer circuits (704-0 and 704-1).

Multiplexer circuit 704-0 can receive multiple data (D0–Dj)/first range (UR0–URj) values, and provide one of the values as an output according to a select signal SEL0 to SELj. Similarly, multiplexer circuit 704-1 can receive multiple mask (M0_ –Mj_)/second range (LR0–LRj) values, and provide one of the values as an output according to a select signal SEL0 to SELj.

Figure 8:
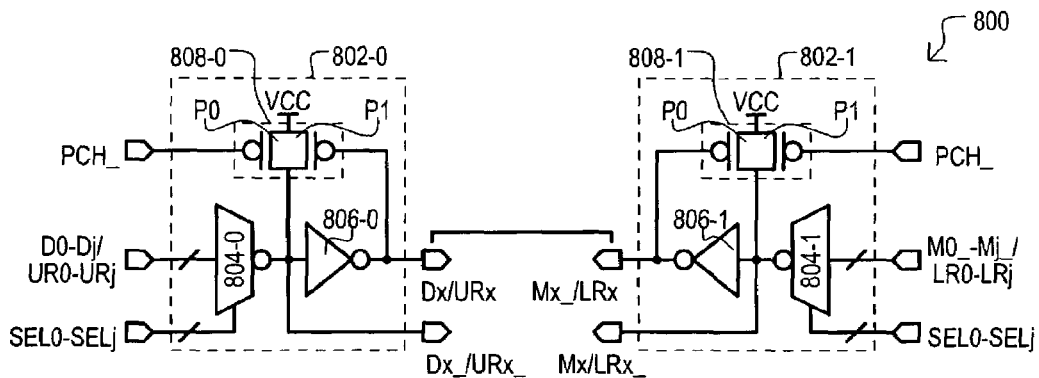
FIG. 8 is a schematic diagram of a multiplexer circuit that may be included in a shared compare section according to one embodiment.
Figure 9:
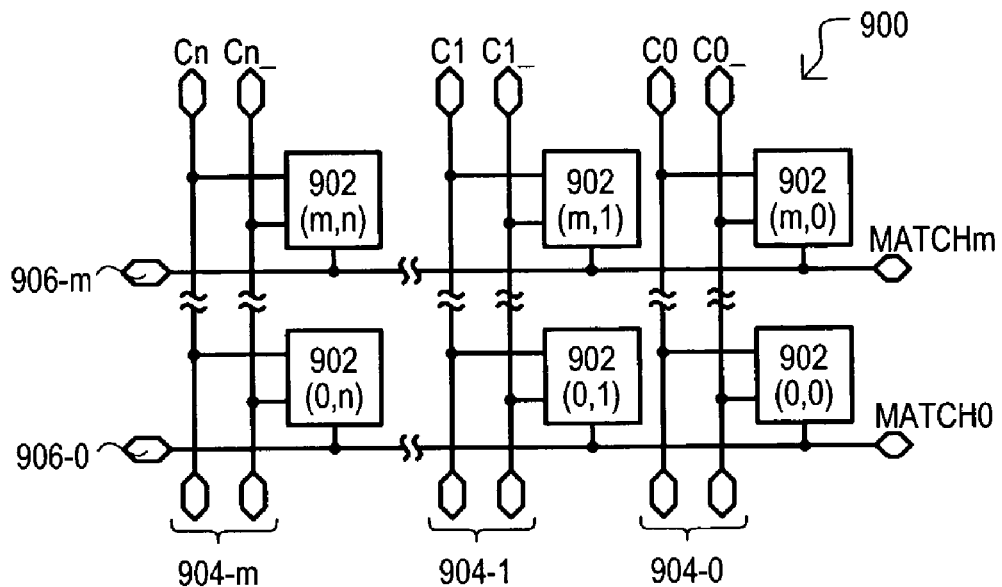
FIG. 9 is a block diagram of a conventional CAM cell array.
Figure 10:
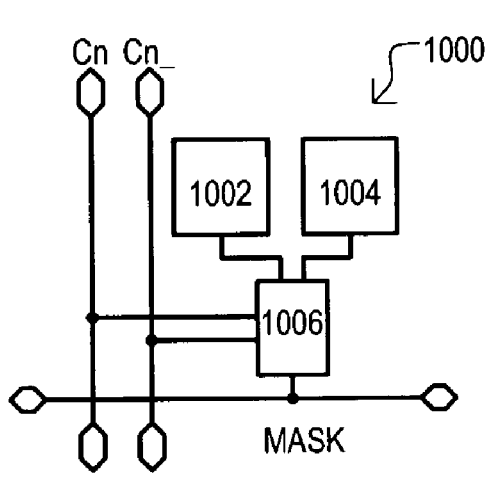
FIG. 10 is a block diagram of a conventional ternary CAM cell.
Figure 11:
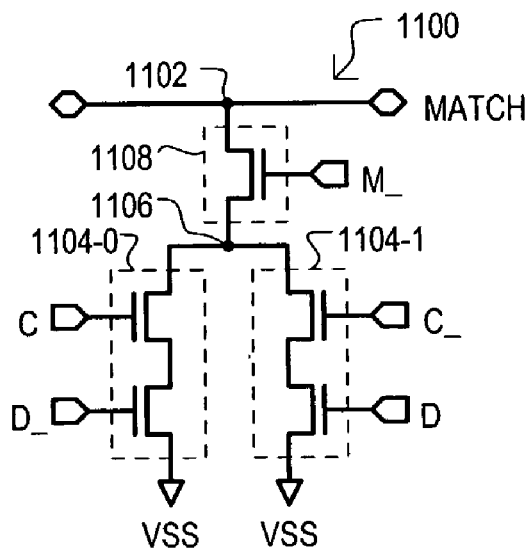
FIG. 11 is a schematic diagram of a compare circuit for a ternary CAM cell.

Referring now to FIG. 8, examples of multiplexer circuits that may be included in a shared compare section are shown in a schematic diagram and designated by the general reference character 800. A first multiplexer circuit 802-0 may include a multiplexer 804-0 that may receive multiple input values (D0–Dj/UR0–URj) and select one such value according to select signals SEL0 to SELj. An output of multiplexer 804-0 may be inverted and provided as an inverted output value Dx_/URx_. Such an inverted output value maybe inverted once again by an inverter 806-0 to generate an output value Dx/URx.

A first multiplexer circuit 802-0 may further include a precharge circuit 808-0 that may precharge an output value to a predetermined value. In the particular example of FIG. 8, a precharge circuit 808-0 can precharge an output value Dx/URx to an inactive (low in this case level). More particularly, a precharge circuit 808-0 may include a precharge transistor P0 and a feedback transistor P1 having source-drain paths arranged in parallel between the output of multiplexer 804-0 and a predetermined precharge voltage VCC. A precharge transistor P0 may receive a precharge signal PCH_ at its gate, while a feedback transistor P1 may receive the output of inverter 806-0 at its gate.

A second multiplexer circuit 802-1 may have the same general configuration as a first multiplexer circuit 802-0.

In this way, range values corresponding to multiple entries may be compared in a single, shared compare section. Such a configuration may provide for a more compact arrangement than approaches that may dedicate separate compare circuits to each bit of an entry. Of course, while the above examples have shown the sharing of one compare section among four locations, fewer or greater numbers of locations may share the same compare section.

It is noted that while the various embodiments have shown arrangement in which a first storage circuits may store data values or upper range values, such an approach should not necessarily be construed as limiting the invention thereto. First storage circuits might store lower range values while second storage locations may store upper range values. Compare logic would then be adjusted according to provide a range comparison for an applied comparand.

It is also noted that while the arrangement of FIG. 2 shows first storage locations and second storage locations within a same memory cell, such an arrangement is a conceptual one and not necessarily a physical one. That is, first storage locations may not necessarily be interposed with second storage locations. A set of first storage locations may exist in a row-wise fashion next to second storage locations.

Still further, while the examples have shown an entry being subject to either a value match or range match, both operations could be performed on the same entry. By activating a mode signal for only a portion of the compare circuits, one portion of an applied comparand can be value matched while another portion could be range matched.

Accordingly, it is understood that while various embodiments have been described in detail, the present invention could be subject various changes, substitutions, and alterations without departing from the spirit and scope of the invention. Accordingly, the present invention is intended to be limited only as defined by the appended claims.

What is claimed is:

1. A content addressable memory (CAM), comprising:
at least one location that compares a comparand value to a maskable data value in a first mode, and determines if a comparand value is within a range defined by a first range value and a second range value in a second mode; and
the at least one location further includes
a first store for storing at least a portion of a data value in a first mode and at least a portion of a first range value in a second mode, and
a plurality of compare sections that each includes a compare circuit having a first circuit path that is disabled and enabled according to at least one comparand value bit and at least one data value bit in the first mode, and according to at least on comparand value bit and at least one first range value bit in the second mode.

2. The CAM of claim 1, wherein:
each compare circuit further includes a second circuit path that is disabled and enabled according to the at least one comparand value bit and the at least one data value bit in the first mode, and according to the at least one comparand value bit and at least one second range value bit in the second mode.

3. The CAM of claim 2, wherein:
the first circuit path is in parallel with the second circuit path and the first and second circuit paths are commonly coupled to a signal node.

4. The CAM of claim 1, wherein:
each compare circuit further includes a mask path between at least the first circuit path and a match indication node that is enabled according to at least one mask value bit.

5. The CAM of claim 4, wherein:
each compare circuit further includes a bypass path in parallel with the mask path that is enabled by a mode signal.

6. A content addressable memory (CAM), comprising:
a plurality of compare sections that each receives a comparand value and provides a first compare result between the comparand value and first CAM cell value in a first mode, and provides a second compare result between the comparand value and first and second CAM cell values in a second mode, the plurality of compare sections coupled to a match line,
each compare section including
at least one first compare circuit coupled to a first CAM cell having a significance with respect to other CAM cells, and
a second compare circuit coupled to a second CAM cell of less significance than the first CAM cell, the second compare circuit receiving a compare result from the first compare circuit in the second mode.

7. The CAM of claim 6, wherein:
the first compare result is maskable by the second CAM cell value in the first mode.

8. The CAM of claim 6, further including:
a plurality of CAM cells; and
each compare section is coupled to at least two CAM cells and a match line.

9. The CAM of claim 6, wherein:
each compare section includes a first compare circuit coupled to a multiplexer circuit, the multiplexer circuit providing a first CAM cell value from a plurality of CAM cells in the first mode.

10. The CAM of claim 8, wherein:
each CAM cell stores a data value bit and a corresponding mask value bit in the first mode, and a first range value bit and corresponding second range value bit in the second mode.

11. A method, comprising the steps of:
comparing a comparand value to a first data value stored in a CAM location in a first mode and masking the first data value according to a second data value in the first mode with a plurality of compare circuits, each compare circuit enabling or disabling a circuit path in response to the comparison between the comparand value and masked first data value; and
comparing a comparand value to first and second data values stored in the CAM location in a second mode with the plurality of compare circuits, each compare circuit enabling or disabling the circuit path in response to the comparison between the comparand value and the first and second data values.

12. The method of 11, wherein:
comparing the comparand value to the first data value includes comparing comparand value bits to first data value bits essentially simultaneously.

13. The method of claim 11, wherein:
comparing the comparand value to the first and second data values includes comparing comparand value bits to first data value bits at a most significant bit position prior to comparing less significant bit positions.

14. The method of claim 13, further including:
disabling comparisons of less significant bit positions with the first data value when a comparison with a more significant bit position indicates the comparand value is within a range limit indicated by the first data value.

15. The method of claim 11, further including:
storing a data value as the first data value and storing a mask value as a second data value in the first mode; and
storing a first range value as the first data value and storing a second range value as a second data value in the second mode.

16. The CAM of claim 6, wherein:
the plurality of compare sections are coupled to a match line, each compare section coupling the match line to a predetermined potential according to the first compare result in the first mode, and coupling the match line to the predetermined potential according to the second compare result in the second mode.

* * * * *

UNITED STATES PATENT AND TRADEMARK OFFICE
CERTIFICATE OF CORRECTION

PATENT NO.        : 7,206,212 B1                                           Page 1 of 1
APPLICATION NO.   : 10/217746
DATED             : April 17, 2007
INVENTOR(S)       : Richard K. Chou It is certified that error appears in the above-identified patent and that said Letters Patent is hereby corrected as shown below:

IN THE SPECIFICATION
At column 9, line 28, please replace "1000" with -- 1000 -- so that the corresponding phrase reads -- second comparand bit "1000" --.

At column 9, line 29, please replace "100" with -- 1100 -- so that the corresponding phrase reads -- upper range bit "1100" --.

Signed and Sealed this

Seventeenth Day of June, 2008

JON W. DUDAS
*Director of the United States Patent and Trademark Office*